(12) United States Patent
Hokenmaier

(10) Patent No.: US 7,170,808 B2
(45) Date of Patent: Jan. 30, 2007

(54) POWER SAVING REFRESH SCHEME FOR DRAMS WITH SEGMENTED WORD LINE ARCHITECTURE

(75) Inventor: Wolfgang Hokenmaier, Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/089,860

(22) Filed: Mar. 25, 2005

(65) Prior Publication Data
US 2006/0215474 A1    Sep. 28, 2006

(51) Int. Cl.
*G11C 8/04* (2006.01)
(52) U.S. Cl. .................. 365/222; 365/149; 365/230.03; 365/239
(58) Field of Classification Search .................. 365/239
See application file for complete search history.

(56) References Cited

U.S. PATENT DOCUMENTS

| | | | | |
|---|---|---|---|---|
| 4,758,993 A * | 7/1988 | Takemae | ..................... | 365/222 |
| 4,933,907 A * | 6/1990 | Kumanoya et al. | ......... | 365/222 |
| 5,251,176 A * | 10/1993 | Komatsu | ..................... | 365/222 |
| 5,631,872 A * | 5/1997 | Naritake et al. | ............. | 365/227 |
| 5,822,264 A * | 10/1998 | Tomishima et al. | ......... | 365/222 |
| 6,570,801 B2 * | 5/2003 | Yoshida et al. | ............. | 365/222 |
| 6,934,211 B2 * | 8/2005 | Hazama et al. | ............. | 365/222 |
| 6,982,917 B2 * | 1/2006 | Lee et al. | ................... | 365/222 |

* cited by examiner

*Primary Examiner*—Tan T. Nguyen
(74) *Attorney, Agent, or Firm*—Patterson & Sheridan, L.L.P.

(57) ABSTRACT

Techniques and apparatus that may be utilized to reduce current consumption during refresh cycles of DRAM devices that utilize wordline segments are provided. Rather than activate and subsequently de-activate (pre-charge) a master wordline each time a corresponding wordline segment is refreshed, the master wordline may remain activated while corresponding wordline segments are refreshed.

13 Claims, 7 Drawing Sheets

POWER SAVING REFRESH SCHEME FOR DRAMS WITH SEGMENTED WORD LINE ARCHITECTURE

BACKGROUND OF THE INVENTION

1. Field of the Invention

The invention generally relates to memory devices and, more particularly, to reducing current consumption during refresh operations.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices.

DRAM devices utilize memory cells (also referred to as storage nodes) consisting of one transistor and one capacitor. The cells are accessed by activating a wordline, switching on the transistor and coupling the capacitor to a bit line. The stored charge on the capacitor is then sensed by a sense amplifier to determine if a logical '1' or '0' bit of data is stored in the accessed cell. Due to leakage current, charge stored in the capacitors may be lost to the point that the corresponding data is no longer valid.

As a result, DRAM devices need refresh operations to maintain their stored data. Refresh operations are typically performed at regular time intervals by means of activating a word line, or a number of word lines, followed by a pre-charge of the same word line or wordlines. This operation is repeated for the next word line or set of word lines until the whole chip is refreshed. Modern DRAM devices determine the word-line address for each refresh operation internally. Each refresh operation is either initiated externally, by means of an external command (e.g., a CAS before RAS or "CBR" refresh command) or internally when the device is in a "self refresh mode" or similar standby-like mode.

To optimize access to storage cells (e.g., to speed access, simplify signal routing, and/or facilitate layout), wordlines are sometimes grouped and controlled by master wordlines. FIG. 1 illustrates a conventional DRAM master wordline arrangement 100. During refresh operations, local wordlines or "wordline segments" 112, are activated by (a) activating the controlling master wordline 110 for the group and (b) asserting a signal on a control line 113 for a corresponding word line segment driver 114 for a particular wordline segment 112 while the master wordline 110 is activated. As illustrated in the refresh timing diagram of FIG. 2, in conventional DRAM devices, the master wordline is activated (204) before, and pre-charged (202) after, activating each wordline segment.

For special-purpose low power DRAM devices, such as those utilized in cellular telephones and personal digital assistants (PDAs), it is important to minimize current consumption, typically to increase battery life. As these devices often spend a large majority of their life in standby modes, requiring refresh to maintain their data (e.g., digital pictures, files, etc.), current consumption during refresh is particularly important. Unfortunately, each cycle of pre-charging and activating the master wordline during refresh operations of conventional DRAM devices results in additional current consumption.

Accordingly, it would be desirable to reduce the amount of current consumption caused by pre-charging and activating the master wordlines during refresh operations.

SUMMARY OF THE INVENTION

Embodiments of the invention generally provide techniques and apparatus for reducing the amount of current consumed during refresh operations of DRAM devices that utilize segmented wordlines.

One embodiment provides a method for refreshing memory cells accessed via wordline segments driven by master wordlines. The method generally includes in response to a first refresh command, activating a master wordline, activating and de-activating a first wordline segment driven by the master wordline; in response a second one or more refresh commands, activating and de-activating a corresponding second one or more wordline segments driven by the master wordline prior to de-activating the master wordline; and in response to a third refresh command, activating and de-activating a third wordline segment driven by the master wordline and de-activating the master wordline.

One embodiment provides a method for refreshing memory cells accessed via wordline segments driven by master wordlines. The method generally includes activating a master wordline in response to a refresh signal and, prior to de-activating the master wordline, sequentially activating a plurality of wordline segments driven by the master wordline to refresh memory cells connected thereto.

Another embodiment provides another method for refreshing memory cells accessed via wordline segments driven by master wordlines. The method generally includes (a) activating a master wordline selected based on an internally generated refresh address, (b) prior to de-activating the selected master wordline, activating a plurality of wordline segments driven by the master wordline to refresh memory cells connected thereto, (c) de-activating the master wordline, (d) adjusting the refresh address, and (e) repeating steps (a)–(c) to refresh memory cells connected to wordline segments driven by other master wordlines.

Another embodiment provides a memory device generally including a plurality of memory cells connected to wordline segments driven by master wordlines and refresh circuitry. The refresh circuitry is generally configured to activate a master wordline in response to a refresh signal and, prior to de-activating the master wordline, sequentially activate a plurality of wordline segments driven by the master wordline to refresh memory cells connected thereto.

Another embodiment provides a memory device generally including a plurality of memory cells connected to wordline segments driven by master wordlines and refresh circuitry. The refresh circuitry is generally configured to (a) activate a master wordline selected based on an internally generated refresh address, (b) prior to de-activating the selected master wordline, activate a plurality of wordline segments driven by the master wordline to refresh memory cells connected thereto, (c) de-activate the master wordline, (d) adjust the refresh address, and (e) repeat steps (a)–(c) to refresh memory cells connected to wordline segments driven by other master wordlines.

Another embodiment provides a dynamic random access memory (DRAM) device generally including a plurality of master wordlines, a plurality of wordline segments driven by the master wordlines, each having a plurality of memory cells connected thereto, and refresh circuitry. The refresh circuitry is generally configured to refresh each of the memory cells during a device refresh cycle during which each of the master wordlines is only activated once to refresh memory cells connected to wordline segments driven thereby.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide techniques and apparatus that may be utilized to reduce current consumption during refresh cycles of DRAM devices that utilize wordline segments. Rather than activate and subsequently de-activate (pre-charge) a master wordline each time a corresponding wordline segment is refreshed, the master wordline may remain activated while corresponding wordline segments are refreshed. As a result, the current needed to charge and discharge the master wordlines and devices connected thereto may be reduced. In fact, each master wordline may only need to be activated one time while refreshing the entire device, which may reduce overall current consumption when the device is in standby mode.

As will be described in greater detail below, for some embodiments, a single wordline segment may be activated for each internally generated or externally supplied refresh command. For such embodiments, the wordline segment refreshed with each command may be determined by an internally generated row address count adjusted (e.g., incremented) with each command. Access control circuitry may be configured to activate a given master wordline when detecting the row address count corresponding to the first corresponding wordline segment driven by that master wordline. The access control circuitry may subsequently deactivate the master wordline only after detecting the row address count corresponding to the last wordline segment driven by the master wordline. For other embodiments, multiple wordline segments (e.g., all segments driven by a selected master wordline) may be activated with each refresh command.

An Exemplary Dram Device

Figure 1:
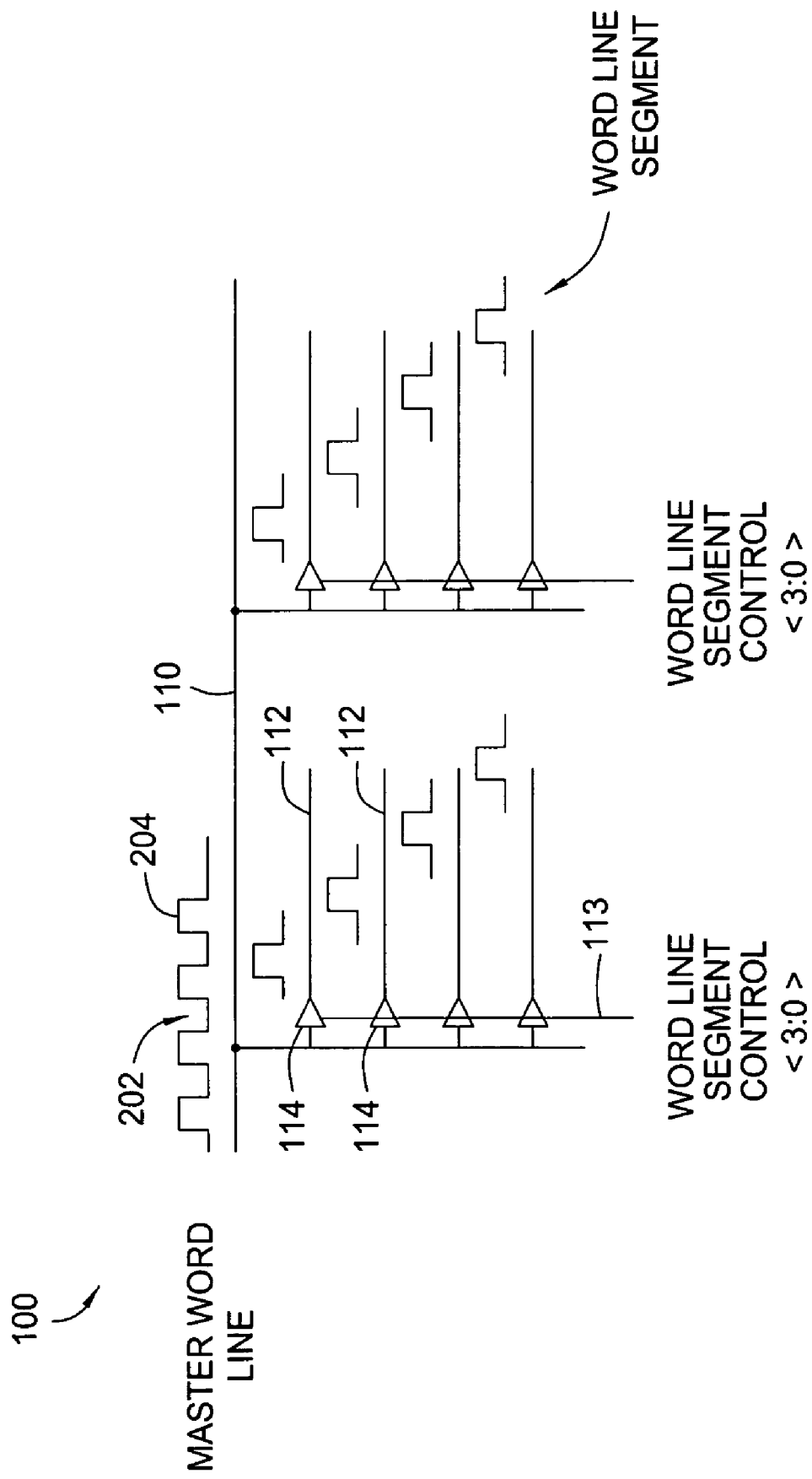
FIG. 1 illustrates an exemplary word line segment refreshed in a conventional manner.
Figure 2:
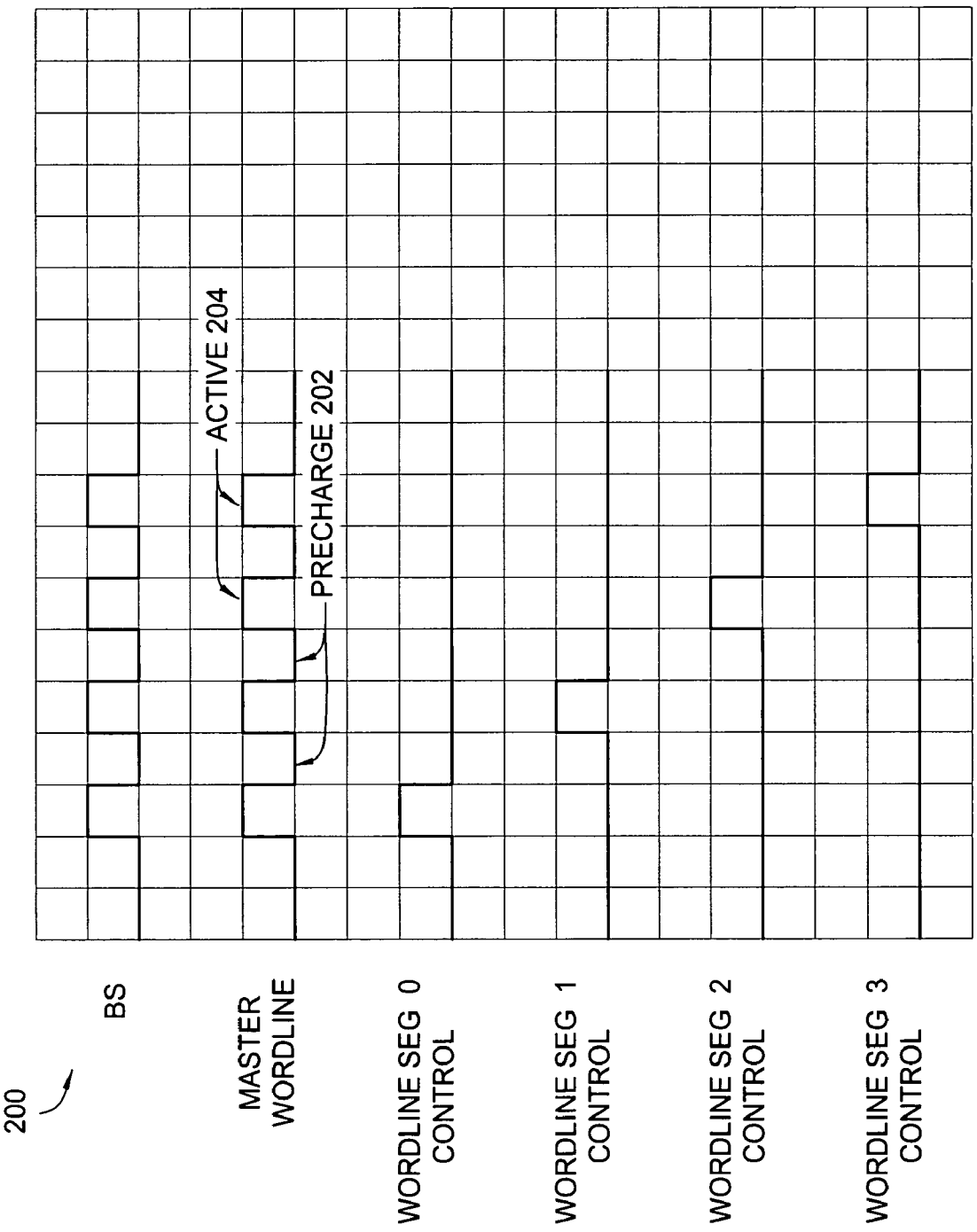
FIG. 2 is a timing diagram of conventional refresh operations for the word line segment of FIG. 1.
Figure 3:
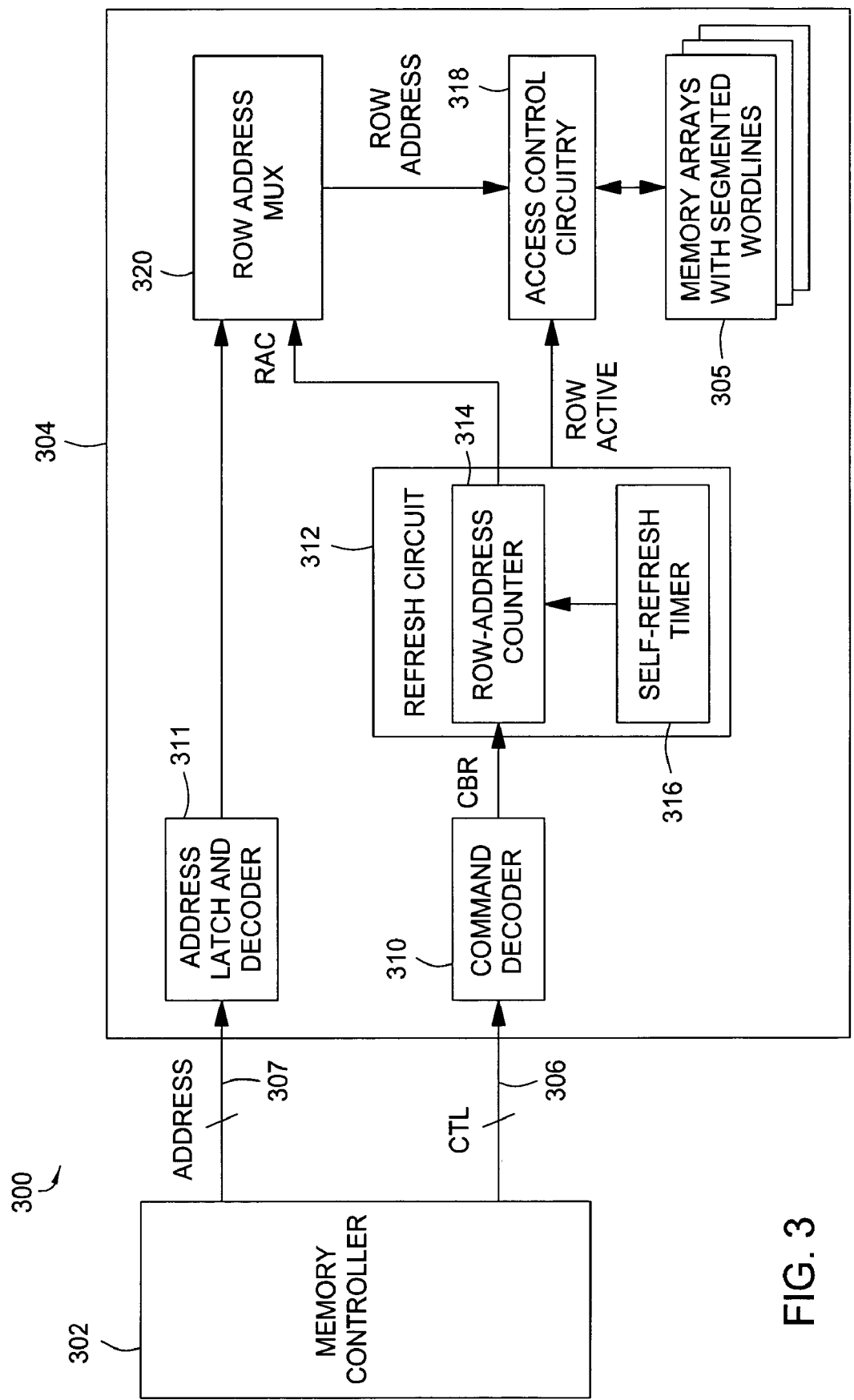
FIG. 3 illustrates an exemplary DRAM device with wordline segments refreshed in accordance with embodiments of the present invention.

FIG. 3 illustrates an exemplary DRAM device 304 with memory arrays 305 having wordline segments refreshed in accordance with embodiments of the present invention. As illustrated, the device 304 may include a refresh circuit 312 to refresh cells in the arrays 305 when the device 304 is in a standby mode.

Depending on such a standby mode, refresh operations for each wordline (or row) in the arrays 305 may be initiated internally or externally. For example, a memory controller 302 may issue refresh commands (e.g., CBR commands), via command lines 306 interpreted by command decoder 310, to the device 304 to initiate refresh operations. Alternatively, the memory controller 302 can place the device 304 in a self-refresh mode whereby refresh operations are generated by an internal self-refresh timer 316. In either case, the particular row of cells refreshed is typically determined by a refresh address generated by a row address counter 314 that is automatically incremented with each refresh operation.

A row address multiplexer 320 may select between the row address generated by the row address counter 314 and a row address generated by an address decoder and latch circuit 311 based on an externally supplied address. In other words, the multiplexer 320 may be controlled such that the row address counter value is selected during refresh operations, while the address generated by the address decoder and latch circuit 311 will be selected during active (read/write) accesses by the memory controller 302.

Master Wordline Refresh Activation

Access control circuitry 318 may be generally configured to activate rows corresponding to the row address received from the row address multiplexer 320. The access control circuitry 318 may be configured to keep master wordlines active, during refresh operations, while each wordline segment driven by the master wordline is refreshed. As previously described, depending on the embodiment, a single wordline segment or multiple wordline segments may be refreshed with each refresh command.

Figure 4:
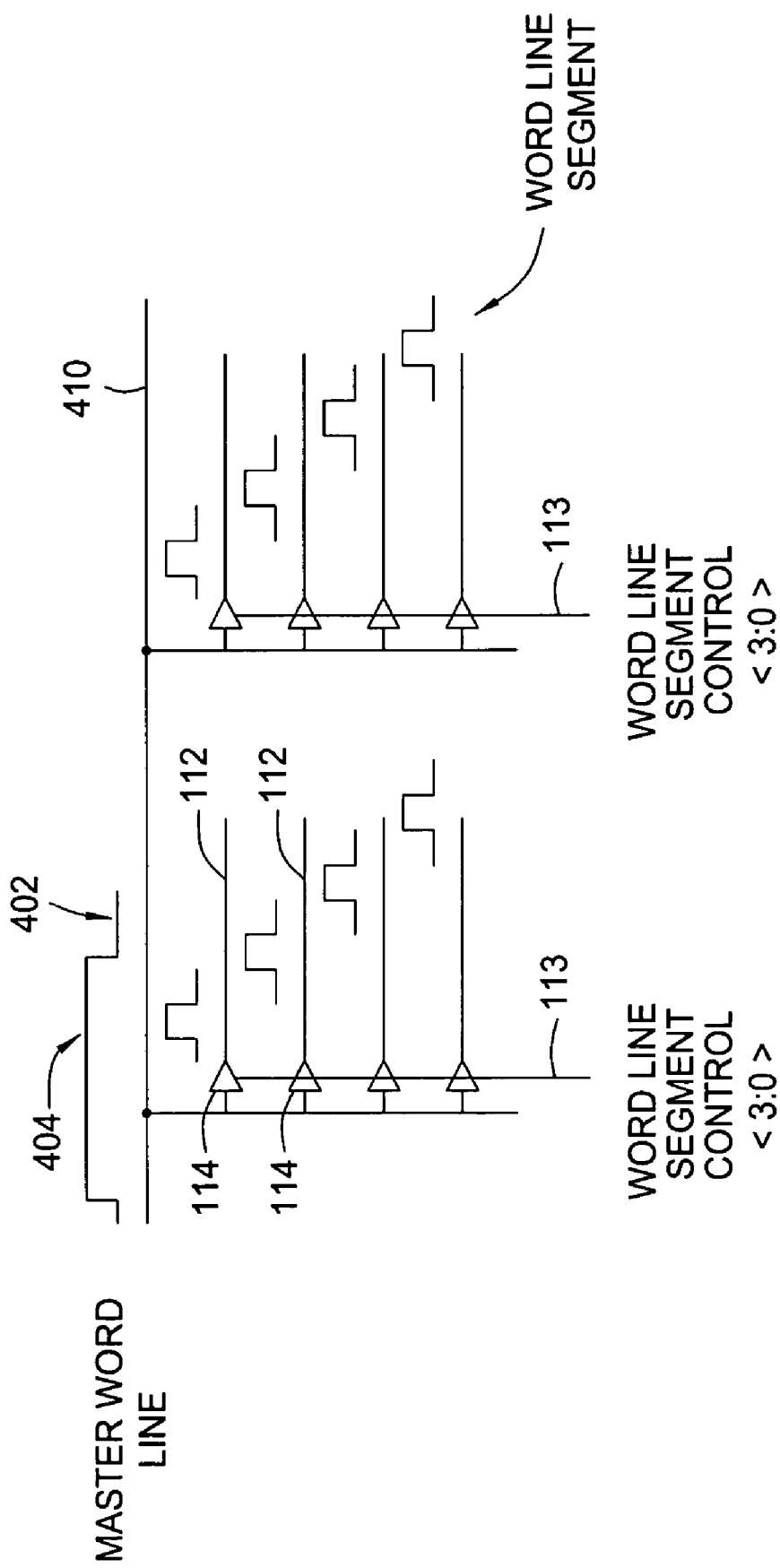
FIG. 4 illustrates an exemplary word line segment refreshed in accordance with embodiments of the present invention.

As illustrated in FIG. 4, the access control circuitry 318 may be configured to generate an active cycle 404 for a master wordline 410 that is long enough in duration to encompass active cycles of all the wordline segments driven by the master wordline 410. In other words, a selected master wordline may remain activated, while the row address counter continues to increment to select the remaining wordline segments driven by the selected master wordline. As a result, each master wordline 410 may be refreshed only once while the entire device is refreshed, thus greatly reducing the number of pre-charge cycles (402) and refresh current consumption.

Figure 5:
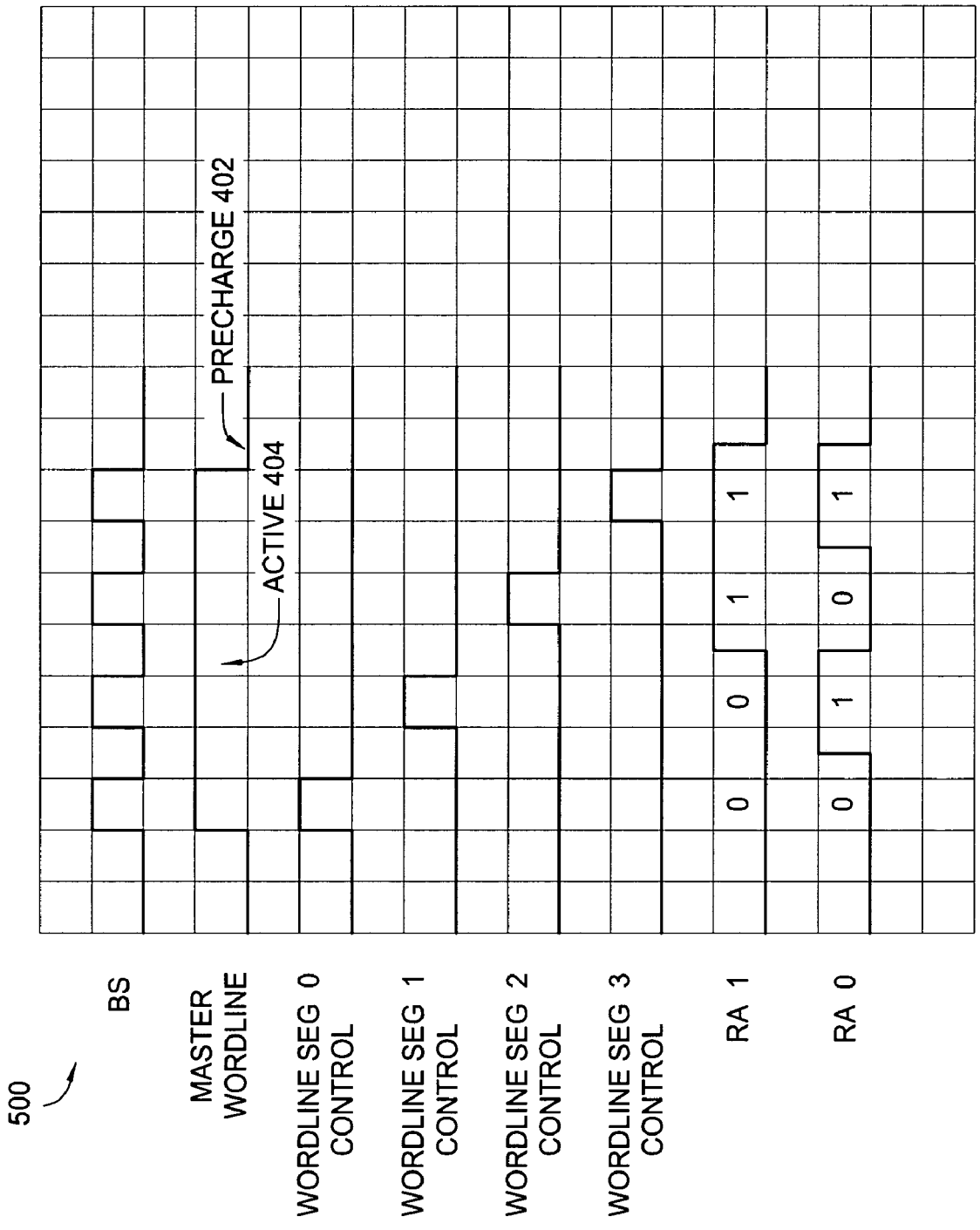
FIG. 5 is a timing diagram of refresh operations for the word line segment of FIG. 4.

As illustrated in FIG. 5, which shows a timing diagram of refresh operations in accordance with embodiments of the present invention, a master wordline (selected based on the row address counter) may be activated in conjunction with a rising edge of a bank select signal. However, rather than de-activate and pre-charge the master wordline on every falling edge of the bank select signal, the master wordline may remain active until the falling edge of the bank select line corresponding to the final wordline segment (driven by the selected master wordline) being refreshed.

Various approaches may be used to achieve the "extended" activate cycle 404 for a selected master wordline. For example, as illustrated in FIG. 5, the wordline segment may be selected by examining the lower bits of the row address (RA<1:0>). Therefore, logic may be implemented in the access control circuitry 318 that, during refresh operations, activates a selected master wordline on a rising edge of the bank select line and de-activates the selected master wordline only when the lower bits are both 1 (e.g., RA<1:0>="11") indicating the final wordline segment driven by the selected master wordline has been refreshed.

Figure 6:
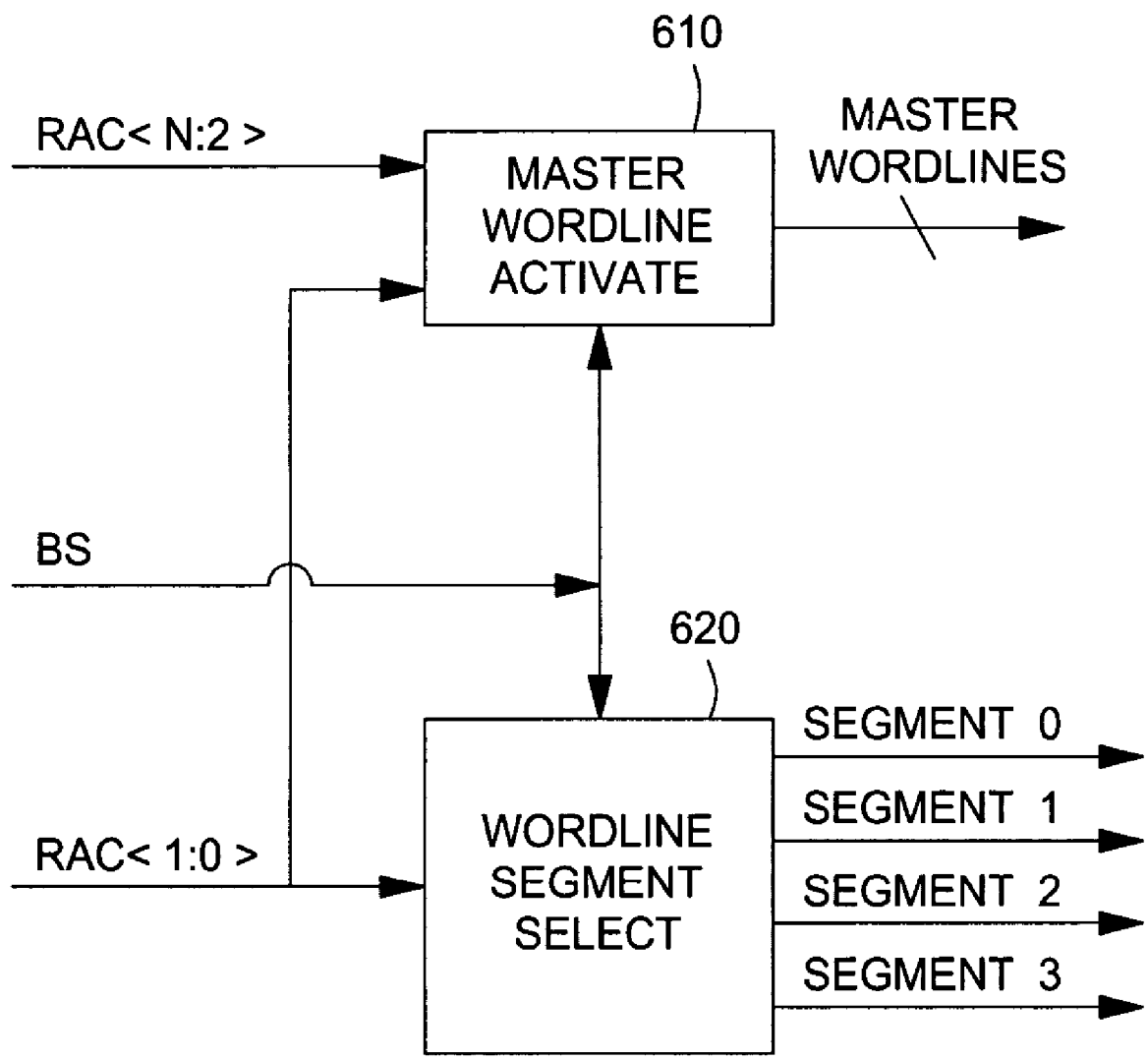
FIG. 6 illustrates exemplary master wordline activate control circuitry in accordance with embodiments of the present invention.

As illustrated in FIG. 6, master wordline activate logic 610 (e.g., included in the access control circuitry 318) may receive, as input, the bank select signal (BS) and lower bits of the row address (RA<1:0>). The master wordline activate logic 610 may include logic to activate a master wordline, selected based on upper bits of the row address (e.g., RA<2:N>), in conjunction with a rising edge of BS, and pre-charge the selected master wordline only after all the corresponding wordline segments have been refreshed. For example, the logic may include a resettable latch with an output that is set on the first rising edge of BS when a master wordline is selected (beginning an ACTIVE period 404), and reset on a falling edge of BS when the final corresponding wordline segment (e.g., as indicated by RA<1:0>="11") has been refreshed (beginning a PRECHARGE period 402).

As illustrated, wordline segment select logic 620 may generate wordline segment control signals (SEG<3:0>) based on the lower bits of the row address. For some embodiments, rather than control the pre-charge cycles based on the lower bits of the row address, the master wordline activate logic 610 may examine a wordline segment control signal (e.g., SEG3="1") for the final wordline segment being refreshed.

In some cases, a refresh counter may be configured to generate refresh row addresses in a manner different than simply incrementing through a counter. For example, in some cases, a Gray code counting technique may be employed in an effort to minimize the number of the row address bits that change each count (thereby reducing the amount of logic switching and corresponding current consumption). In such cases, rather than simply examine the lower bits of the row address to determine which segment is selected, some other type of decoding to translate a Gray code output may be utilized.

Exemplary Refresh Operations

Figure 7:
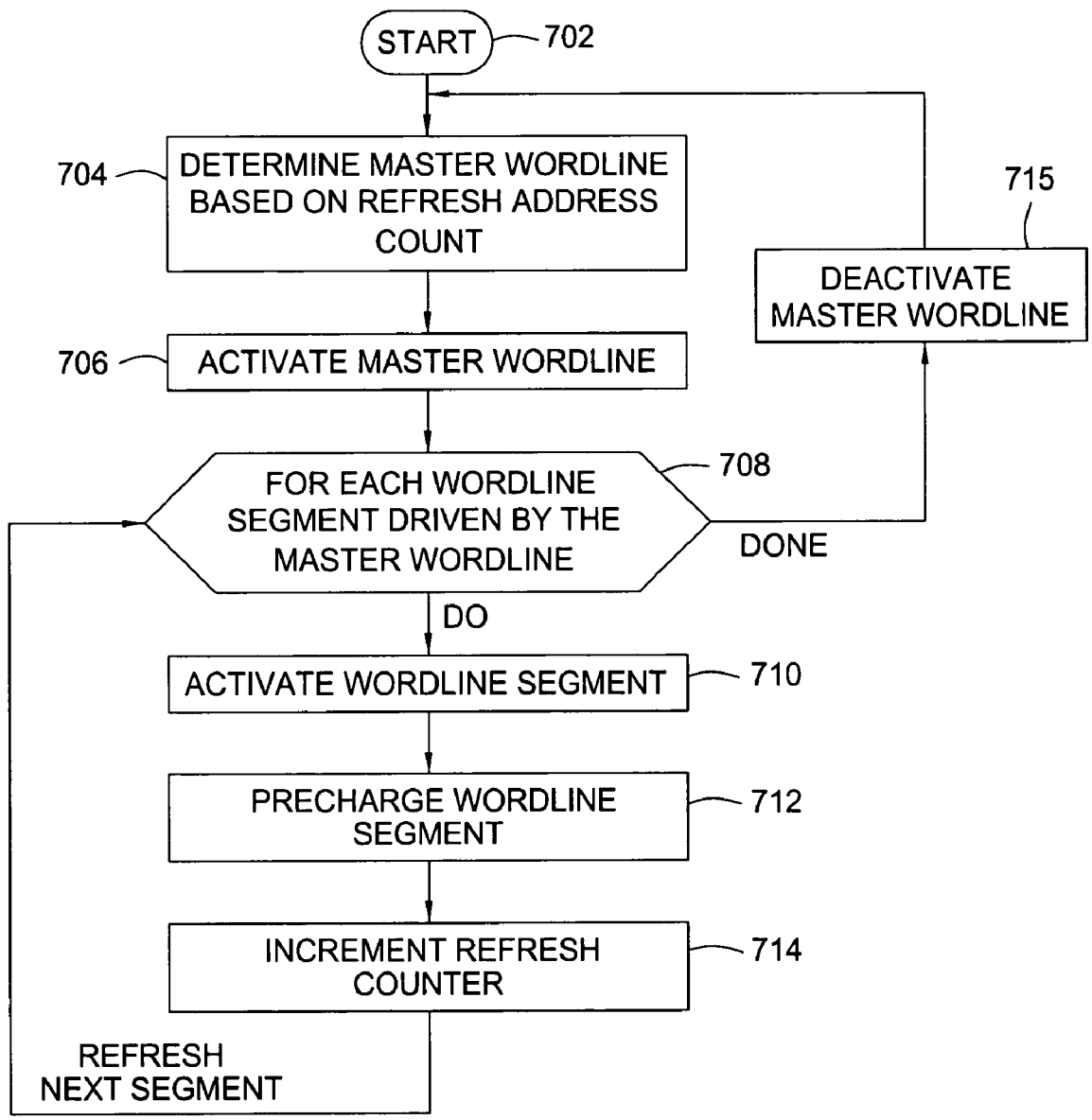
FIG. 7 is a flow diagram of exemplary operations for performing refresh operations in accordance with embodiments of the present invention.

FIG. 7 is a flow diagram of exemplary operations that illustrate how a DRAM device may be refreshed in accordance with embodiments of the present invention. The operations begin, at step 702, for example, when the device is placed in a self-refresh mode, or an external refresh command is received. At step 704, a master wordline is selected based on the current value of the refresh address counter and, at step 706, the selected master wordline is activated.

At step 708, a loop of operations 710–714 for refreshing each wordline segment controlled by the selected master wordline while the selected wordline is kept active. At step 710, a wordline segment driven by the activated master wordline is activated in order to refresh any cells connected thereto. At step 712, the activated wordline segment is pre-charged (de-activated). At step 714, the refresh counter is incremented, thereby selecting the next wordline segment.

Once the operations 710–714 have been repeated to refresh every wordline segment driven by the selected master wordline, the selected master wordline is de-activated, at step 715 and the operations return to step 704, to select the next master wordline. The illustrated refresh operations may be repeated until the entire device has been refreshed, with each master wordline being activated just once for each device refresh cycle.

Of course, these operations may be interrupted, for example, if the device exits the standby mode and is accessed for normal operation (e.g., to read/write data). In this case, a master wordline with a different address than the currently selected master wordline may be accessed. In response, any master wordline currently activated for refresh may be de-activated (pre-charged), while the new master wordline is activated for the normal access. In other words, the refresh operation may be postponed, which may help ensure that certain timing specifications for the active cycle are met. Because the master wordline that was being refreshed may be forcefully pre-charged, the power savings may be reduced slightly. However, this is typically acceptable as much more current draw is typically allowed in an active mode than in a standby (refresh) mode. Because the refresh address counter typically changes only when refresh operations are being performed, once the standby mode is re-entered, refresh operations may resume at the same master wordline and wordline segment that was being refreshed when refresh operations were interrupted.

For some embodiments, refresh operations may be performed in what may be referred to as a "burst mode" with several wordline segments being refreshed rapidly. For example, rather than refresh a single wordline segment in response to each externally supplied refresh command or internal refresh signal (generated by the self refresh timer), all wordline segments driven to a master wordline may be refreshed in a burst. In other words, rather than space the refresh operations for each wordline segment at a period $t_{REFRESH}$, the refresh operations may be performed for each master wordline at a period of $t_{REFRESH} \times N$, with N being the number of wordline segments driven by a master wordline. While each master wordline would still only be activated one time per total device refresh, this approach may result in shorter active periods for each master wordlines which, in some cases, may reduce corresponding leakage current.

CONCLUSION

By maintaining a master wordline active while wordline segments driven by the master wordline are refreshed, a number of current consuming pre-charge and re-charge cycles for the master wordline may be eliminated when compared to conventional refresh techniques. As a result, refresh current consumption caused by pre-charging and re-charging master wordlines may be reduced.

While the foregoing is directed to embodiments of the present invention, other and further embodiments of the invention may be devised without departing from the basic scope thereof, and the scope thereof is determined by the claims that follow.

What is claimed is:

1. A method for refreshing memory cells accessed via wordline segments driven by master wordlines, comprising:
    activating the master wordline in response to a refresh signal, wherein the activated master wordline is selected based on an internally generated refresh address;
    prior to de-activating the master wordline, sequentially activating a plurality of wordline segments driven by the master wordline to refresh memory cells connected thereto; and
    de-activating the master wordline as a function of one or more bits of the internally generated refresh address.

2. The method of claim 1, wherein each of the plurality of segment wordlines are activated prior to receiving another refresh signal.

3. The method of claim 1, wherein the refresh signal is generated in response to an externally received command.

4. A method for refreshing memory cells accessed via wordline segments driven by master wordlines, comprising:
   (a) activating a master wordline selected based on an internally generated refresh address;
   (b) prior to de-activating the selected master wordline, activating a plurality of wordline segments driven by the master wordline to refresh memory cells connected thereto;
   (c) de-activating the master wordline;
   (d) adjusting the refresh address; and
   (e) repeating steps (a)–(c) to refresh memory cells connected to wordline segments driven by other master wordlines, wherein de-activating the master wordline comprises de-activating the master wordline as a function of one or more bits of the internally generated refresh address.

5. The method of claim 4, wherein activating a plurality of wordline segments driven by the master wordline comprises sequentially activating each wordline segment driven by the master wordline, wherein the refresh address is adjusted after each wordline segment activation.

6. A memory device, comprising:
   a plurality of memory cells connected to wordline segments driven by master wordlines;
   refresh circuitry configured to; and
   refresh circuitry configured to select a master wordline for activation based on an internally generated refresh address, activate the selected master wordline in response to a refresh signal and, prior to de-activating the master wordline, sequentially activate a plurality of wordline segments driven by the master wordline to refresh memory cells connected thereto, wherein the refresh circuitry is further configured to de-activate the master wordline as a function of one or more bits of the internally generated refresh address.

7. The memory device of claim 6, wherein the refresh circuitry is configured to de-activate the master wordline only after every wordline segment driven by the master wordline has been activated.

8. The memory device of claim 6, wherein the refresh circuitry is configured to activate each of the plurality of segment wordlines prior to receiving another refresh signal.

9. The memory device of claim 6, wherein the refresh signal is generated in response to an externally received command.

10. A memory device, comprising:
    a plurality of memory cells connected to wordline segments driven by master wordlines;
    refresh circuitry configured to:
    (a) activate a master wordline selected based on an internally generated refresh address;
    (b) prior to de-activating the selected master wordline, activate a plurality of wordline segments driven by the master wordline to refresh memory cells connected thereto;
    (c) de-activate the master wordline;
    (d) adjust the refresh address; and
    (e) repeat steps (a)–(c) to refresh memory cells connected to wordline segments driven by other master wordlines, wherein the refresh circuitry is configured to activate a plurality of wordline segments driven by the master wordline by sequentially activating each wordline segment driven by the master wordline and adjust the refresh address after each wordline segment activation and wherein the refresh circuitry is configured to de-activate the master wordline as a function of one or more bits of the internally generated refresh address.

11. A memory device, comprising:
    a plurality of memory cells connected to wordline segments driven by master wordlines;
    means for internally generating a refresh address; and
    means for activating a master wordline in response to a refresh signal and, prior to de-activating the master wordline, sequentially activating a plurality of wordline segments driven by the master wordline to refresh memory cells connected thereto, wherein the means for activating the master wordline is configured to select master wordlines for activation based on the internally generated refresh address.

12. The memory device of claim 11, wherein the means for activating the master wordline is configured to de-activate the master wordline only after every wordline segment driven by the master wordline has been activated.

13. The memory device of claim 11, wherein the means for activating the master wordline is configured to activate each of the plurality of wordline segments prior to receiving another refresh signal.

* * * * *